(12) United States Patent  
Hashimoto et al.

(10) Patent No.: US 7,884,393 B2
(45) Date of Patent: Feb. 8, 2011

(54) HIGH ELECTRON MOBILITY TRANSISTOR, FIELD-EFFECT TRANSISTOR, AND EPITAXIAL SUBSTRATE

(75) Inventors: Shin Hashimoto, Itami (JP); Makoto Kiyama, Itami (JP); Takashi Sakurada, Osaka (JP); Tatsuya Tanabe, Itami (JP); Kouhei Miura, Osaka (JP); Tomihito Miyazaki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/786,440

(22) Filed: May 25, 2010

(65) Prior Publication Data

US 2010/0230723 A1 Sep. 16, 2010

Related U.S. Application Data

(62) Division of application No. 11/571,156, filed as application No. PCT/JP2006/304043 on Mar. 3, 2006, now Pat. No. 7,749,828.

(30) Foreign Application Priority Data

May 26, 2005 (JP) ............................. 2005-154406

(51) Int. Cl.
    *H01L 29/778* (2006.01)
(52) U.S. Cl. .................. 257/192; 257/20; 257/194; 257/E21.403

(58) Field of Classification Search .................. 257/192
See application file for complete search history.

(56) References Cited

U.S. PATENT DOCUMENTS

| 7,030,428 | B2* | 4/2006 | Saxler ........................ 257/194 |
| 7,326,971 | B2* | 2/2008 | Harris et al. ................ 257/194 |
| 2006/0102926 | A1* | 5/2006 | Kikkawa et al. ............ 257/103 |
| 2008/0124851 | A1* | 5/2008 | Zhang et al. ............... 438/172 |
| 2010/0207138 | A1* | 8/2010 | Nakahata et al. .............. 257/94 |

* cited by examiner

*Primary Examiner*—Kenneth A Parker
*Assistant Examiner*—Jose R Diaz
(74) *Attorney, Agent, or Firm*—James W. Judge

(57) ABSTRACT

Affords high electron mobility transistors having a high-purity channel layer and a high-resistance buffer layer. A high electron mobility transistor (11) is provided with a supporting substrate (13) composed of gallium nitride, a buffer layer (15) composed of a first gallium nitride semiconductor, a channel layer (17) composed of a second gallium nitride semiconductor, a semiconductor layer (19) composed of a third gallium nitride semiconductor, and electrode structures (a gate electrode (21), a source electrode (23) and a drain electrode (25)) for the transistor (11). The band gap of the third gallium nitride semiconductor is broader than that of the second gallium nitride semiconductor. The carbon concentration $N_{C1}$ of the first gallium nitride semiconductor is $4\times10^{17}$ cm$^{-3}$ or more. The carbon concentration $N_{C2}$ of the second gallium nitride semiconductor is less than $4\times10^{16}$ cm$^{-3}$.

4 Claims, 8 Drawing Sheets

HIGH ELECTRON MOBILITY TRANSISTOR, FIELD-EFFECT TRANSISTOR, AND EPITAXIAL SUBSTRATE

BACKGROUND OF THE INVENTION

1. Technical Field

The present invention relates to high electron mobility transistors, field-effect transistors, metal-semiconductor (MES) field-effect transistors, metal-insulator-semiconductor (MIS) field-effect transistors, epitaxial substrates, methods of manufacturing epitaxial substrates, and methods of manufacturing Group III nitride transistors.

2. Background Art

Non-Patent Document 1 discloses an AlGaN/GaN high electron mobility transistor having a recess gate structure. The epitaxial layer composed of AlGaN/GaN is formed on the (0001) plane of a sapphire substrate by metal organic chemical vapor deposition. The epitaxial layer includes a GaN nucleation layer having a thickness of 20 nm, an undoped GaN layer having a thickness of 2.5 µm, an $Al_{0.26}Ga_{0.74}N$ barrier layer, an $n^+$-$Al_{0.26}Ga_{0.74}N$ layer having a thickness of 20 nm, and an $n^+$-GaN layer having a thickness of 20 nm. The flow rates of ammonia and triethygallium in order to grow the undoped GaN layer are 5 liters/minute and 69 µmol/minute, respectively. In order to grow the AlGaN layer, the flow rates of ammonia, triethygallium and trimethyl aluminum are 5 liters/minute, 29.5 µmol/minute, and 5.2 µmol/minute, respectively.

Non-Patent Document 1: T. Egawa, et al., *Applied Physics Letters*, Vol. 76, No. 1, pp. 121-123, Jan. 3, 2000.

Improvement in the characteristics of Group III nitride transistors such as high electron mobility transistors and field-effect transistors has been sought. In order to do so, it is necessary to embody high quality in the channel layer, and to keep the resistivity of the buffer layer high. However, in past research, there has been no concrete method to improve the quality of the channel layer and the resistivity of the buffer layer. According to the research of the inventors, the quality of the channel layer and the resistivity of the buffer layer are related to carbon concentrations in these nitride semiconductor layers. Experiments by the inventors have demonstrated that it is possible to grow the semiconductor by controlling the carbon concentrations in the nitride semiconductor layers. By exploiting this result, transistors having a high-purity channel layer and a high-resistance buffer layer can be manufactured.

BRIEF SUMMARY OF THE INVENTION

It is an object of the present invention, in view of the circumstances noted above, to make available high electron mobility transistors and field-effect transistors having a high-purity channel layer and a high-resistance buffer layer. It is another object of the present invention to make available epitaxial substrates for manufacturing these transistors. It is a further other object of the present invention to make available methods of manufacturing epitaxial substrates and methods of manufacturing Group III nitride transistors.

According to an aspect of the present invention, a high electron mobility transistor comprises (a) a supporting substrate composed of gallium nitride, (b) a buffer layer composed of a first gallium nitride semiconductor provided on the supporting substrate, (c) a channel layer composed of a second gallium nitride semiconductor provided on the buffer layer, (d) a semiconductor layer composed of a third gallium nitride semiconductor formed on the buffer layer, the third gallium nitride semiconductor having the band gap broader than that of the second gallium nitride semiconductor, and (e) a gate electrode, a source electrode and a drain electrode provided on the semiconductor layer. The carbon concentration of the first gallium nitride semiconductor is $4\times10^{17}$ $cm^{-3}$ or more, and the carbon concentration of the second gallium nitride semiconductor is less than $4\times10^{16}$ $cm^{-3}$.

According to the high electron mobility transistor, since the carbon concentration of the first gallium nitride semiconductor is $4\times10^{17}$ $cm^{-3}$ or more, a buffer layer having a high resistivity can be provided. Since the carbon concentration of the second gallium nitride semiconductor is less than $4\times10^{16}$ $cm^{-3}$, a channel layer having a low impurity concentration can be provided.

According to another aspect of the present invention, a field-effect transistor comprises (a) a supporting substrate composed of gallium nitride, (b) a buffer layer composed of a first gallium nitride semiconductor formed on the supporting substrate, (c) a channel layer composed of a second gallium nitride semiconductor formed on the buffer layer, and (d) a gate electrode, a source electrode and a drain electrode provided on the channel layer. The carbon concentration of the first gallium nitride semiconductor is $4\times10^{17}$ $cm^{-3}$ or more, and the carbon concentration of the second gallium nitride semiconductor is less than $4\times10^{16}$ $cm^{-3}$.

According to the field-effect transistor, since the carbon concentration of the first gallium nitride semiconductor is $4\times10^{17}$ $cm^{-3}$ or more, a buffer layer having a high resistivity can be provided. Since the carbon concentration of the second gallium nitride semiconductor is less than $4\times10^{16}$ $cm^{-3}$, a channel layer having a low impurity concentration can be provided.

A further other aspect of the present invention involves an epitaxial substrate for Group III nitride transistors. The epitaxial substrate comprises (a) a gallium nitride substrate, (b) a first semiconductor film composed of a first gallium nitride semiconductor provided on the gallium nitride substrate, and (c) a second semiconductor film composed of a second gallium nitride semiconductor provided on the first semiconductor film. The carbon concentration of the first gallium nitride semiconductor is $4\times10^{17}$ $cm^{-3}$ or more, and the carbon concentration of the second gallium nitride semiconductor is less than $4\times10^{16}$ $cm^{-3}$.

Since the epitaxial substrate includes a second semiconductor film having a low impurity concentration formed on a first semiconductor film having a high resistivity, the epitaxial substrate is preferable for Group III nitride transistors such as field-effect transistors.

The epitaxial substrate according to the present invention further comprises (d) a third semiconductor film composed of a third gallium nitride semiconductor having the band gap broader than that of the second gallium nitride semiconductor. The third semiconductor film is provided on the first semiconductor film.

Since the epitaxial substrate includes a second semiconductor film having a low impurity concentration formed on a first semiconductor film having a high resistivity, the epitaxial substrate is preferable for Group III nitride transistors such as high electron mobility transistors.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor onto a gallium nitride substrate; and (b) a step, by utilizing metal organic chemical vapor deposition, of growing a channel layer composed of a second gallium nitride semiconductor onto the buffer layer. The flow rate of organic gallium at which the channel layer is grown is lower than the flow rate of organic gallium at which the buffer layer is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacture conditions where the flow rate of the organic gallium at which the channel layer is grown is lower than the flow rate of the organic gallium at which the buffer layer is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor onto a gallium nitride substrate, and (b) a step, by utilizing metal organic chemical vapor deposition, of growing a channel layer composed of a second gallium nitride semiconductor onto the buffer layer. The flow rate of nitrogen source at which the channel layer is grown is higher than the flow rate of nitrogen source at which the buffer layer is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacture conditions where the flow rate of the nitrogen source at which the channel layer is grown is higher than the flow rate of the nitrogen source at which the buffer layer is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor onto a gallium nitride substrate, and (b) a step, by utilizing metal organic chemical vapor deposition, of growing a channel layer composed of a second gallium nitride semiconductor onto the buffer layer. The (Group V source flow rate)/(Group III source flow rate) with which the channel layer is grown is higher than the (Group V source flow rate)/(Group III source flow rate) with which the buffer layer is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacture conditions where the (Group V source flow rate)/(Group III source flow rate) with which the channel layer is grown is higher than the (Group V source flow rate)/(Group III source flow rate) with which the buffer layer is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor onto a gallium nitride substrate, and (b) a step, by utilizing metal organic chemical vapor deposition, of growing a channel layer composed of a second gallium nitride semiconductor onto the buffer layer. The temperature at which the channel layer is grown is higher than the temperature at which the buffer layer is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacture conditions where the temperature at which the channel layer is grown is higher than the temperature at which the buffer layer is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing a decompression metal organic chemical vapor deposition, of growing a buffer layer composed of a first gallium nitride semiconductor onto a gallium nitride substrate, and (b) a step, by utilizing metal organic chemical vapor deposition, of growing a channel layer composed of a second gallium nitride semiconductor onto the buffer layer. The pressure at which the channel layer is grown is higher than the pressure at which the buffer layer is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacturing conditions where the pressure at which the channel layer is grown is higher than the pressure at which the buffer layer is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor onto a gallium nitride substrate, and (b) a step, by utilizing metal organic chemical vapor deposition, of growing a channel layer composed of a second gallium nitride semiconductor onto the buffer layer. The speed at which the first gallium nitride semiconductor is grown is higher than the speed at which the second gallium nitride semiconductor is grown. The carbon concentration of the first gallium nitride semiconductor is $4 \times 10^{17}$ cm$^{-3}$ or more, and the carbon concentration of the second gallium nitride semiconductor is less than $4 \times 10^{16}$ cm$^{-3}$.

According to this method, the buffer layer and the channel layer are grown on the gallium nitride substrate under manufacture conditions where the speed at which the first gallium nitride semiconductor is grown is higher than the speed at which the second gallium nitride semiconductor is grown. Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

A further other aspect of the present invention involves a method of manufacturing epitaxial substrates for Group III nitride transistors. The method comprises (a) a step, by utilizing metal organic chemical vapor deposition, of growing a buffer layer composed of a first gallium nitride semiconductor having a carbon concentration of $4 \times 10^{17}$ cm$^{-3}$ or more onto a gallium nitride substrate, and (b) a step, by utilizing metal organic chemical vapor deposition, of growing a channel layer composed of a second gallium nitride semiconductor having a carbon concentration of less than $4 \times 10^{16}$ cm$^{-3}$ onto the buffer layer. During the growth of the buffer layer and the channel layer, at least any of conditions among the following conditions (1) through (6) is satisfied:

(1) The flow rate of organic gallium at which the channel layer is grown is lower than the flow rate of organic gallium at which the buffer layer is grown.
(2) The flow rate of nitrogen source at which the channel layer is grown is higher than the flow rate of nitrogen source at which the buffer layer is grown.
(3) The (Group V source flow rate)/(Group III flow rate) at which the channel layer is grown is higher than (Group V source flow rate)/(Group III flow rate) at which the buffer layer is grown.
(4) The temperature at which the channel layer is grown is higher the temperature at which the buffer layer is grown.
(5) The pressure at which the channel layer is grown is higher than the pressure at which the buffer layer is grown.
(6) The speed at which the first gallium nitride semiconductor is grown is higher than the speed at which the second gallium nitride semiconductor is grown.

According to this method, the buffer layer and the channel layer are grown on the gallium nitride substrate under manufacture conditions including at least any of the above described (1) through (6). Accordingly, it is possible to set the carbon concentration of the semiconductor for the buffer layer to be $4 \times 10^{17}$ cm$^{-3}$ or more, and to set the carbon concentration of the semiconductor for the channel layer to be less than $4 \times 10^{16}$ cm$^{-3}$.

Furthermore, according to a method of manufacturing an epitaxial substrate involving a further other aspect of the present invention, epitaxial substrates for Group III nitride transistors such as field-effect transistors can be provided.

A further other aspect of the present invention further comprises (c) a step, by utilizing metal organic chemical vapor deposition, of growing a layer composed of Group III nitride semiconductor onto the channel layer. The band gap of the second gallium nitride semiconductor is narrower than that of the Group III nitride semiconductor. According to this method, epitaxial substrates for the Group III nitride transistors such as high electron mobility transistors can be provided.

A further other aspect of the present invention involves a method of manufacturing Group III nitride transistors. The method comprises (a) a step of manufacturing an epitaxial substrate by utilizing any of the methods of manufacturing an epitaxial substrate for Group III nitride transistors, and (b) a step of forming an electrode for the Group III nitride transistor onto the epitaxial substrate. According to this method, transistors having a high-purity channel layer and a high-resistance buffer layer can be manufactured.

From the following detailed description on preferable embodiments according to the present invention in conjunction with the accompanying drawings, the foregoing and other objects, features, aspects and advantages of the present invention will become readily apparent to those skilled in the art.

As described above, according to the present invention, it is possible to provide high electron mobility transistors and field-effect transistors having a high-purity channel layer and a high-resistance buffer layer, to provide epitaxial substrates for manufacturing these transistors, and to provide methods of manufacturing the epitaxial substrates and Group III nitride transistors.

LEGEND

11: high electron mobility transistor; 13: supporting substrate; 15: buffer layer; 17: channel layer; 19: semiconductor layer; 21: gate electrode; 23: source electrode; 25: drain electrode; 27: two-dimensional electron gas; 31: MES field-effect transistor; 33: supporting substrate; 35: buffer layer; 37: channel layer; 41: gate electrode; 43: source electrode; 45: drain electrode; L1-L8: undoped gallium nitride layer;

E1-E8: epitaxial substrate; G1-G12: source gas; 61: gallium nitride substrate; 63: reactor; 65, 67, 71, 73, 77, 79, 83, 85: gallium nitride epitaxial film; 69, 75, 81, 87: AlGaN epitaxial film.

DETAILED DESCRIPTION OF THE INVENTION

Insights into the present invention will be readily understood in conjunction with the following detailed description with reference the accompanying figures for illustration. Hereinafter, referring to the accompanying figures, embodiments of the present invention according to the high electron mobility transistors, the field-effect transistors, the epitaxial substrates, the method of manufacturing the epitaxial substrate, and Group III nitride transistor will be described. Note that where possible identical components are labeled with the same reference marks.

Embodiment Mode 1

Figure 1:
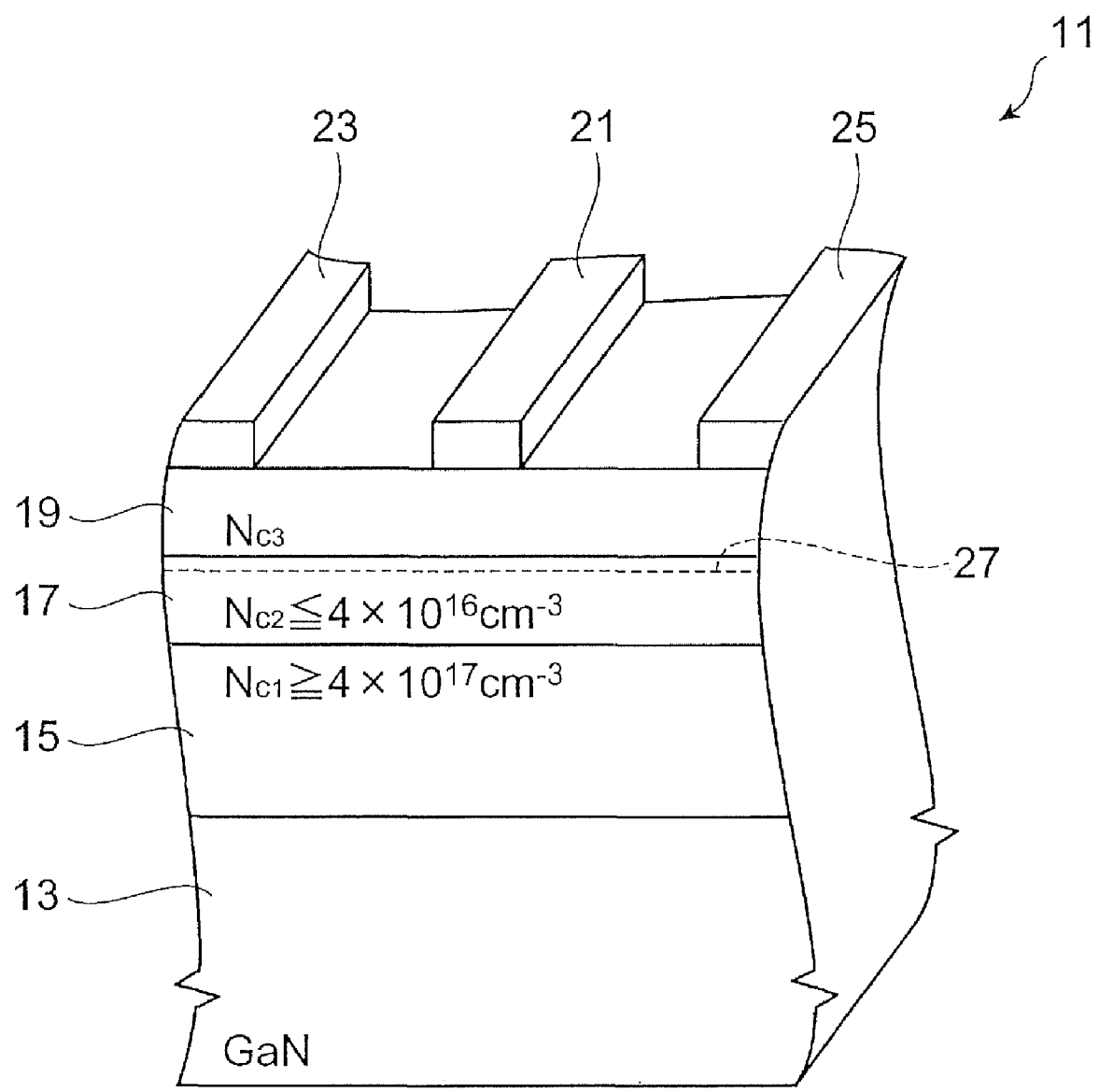
FIG. 1 is a view representing the structure of the high electron mobility transistor involving the preset embodiment.

FIG. 1 represents a structure of a high electron mobility transistor involving the present embodiment. The high electron mobility transistor 11 includes a supporting substrate 13 composed of gallium nitride, a buffer layer 15 composed of a first gallium nitride semiconductor, a channel layer 17 composed of a second gallium nitride semiconductor, a semiconductor layer 19 composed of a third gallium nitride semiconductor, and electrode structures (a gate electrode 21, a source electrode 23 and a drain electrode 25) for the transistor 11. The buffer layer 15 is disposed on the supporting substrate 13. The channel layer 17 is disposed on the buffer layer 15. The semiconductor layer 19 is disposed on the channel layer 17. The band gap of the third gallium nitride semiconductor is broader than that of the second gallium nitride semiconductor. The gate electrode 21, the source electrode 23 and the drain electrode 25 are disposed on the semiconductor layer 19. The carbon concentration $N_{C1}$ of the first gallium nitride semiconductor is $4 \times 10^{17}$ cm$^{-3}$ or more. The carbon concentration $N_{C2}$ of the second gallium nitride semiconductor is less than $4 \times 10^{16}$ cm$^{-3}$.

According to the high electron mobility transistor 11, since the carbon concentration $N_{C1}$ of the first gallium nitride semiconductor is $4 \times 10^{17}$ cm$^{-3}$ or more, it is possible to afford the buffer layer 15 having a high resistivity. Furthermore, since the carbon concentration $N_{C2}$ of the second gallium nitride semiconductor is less than $4 \times 10^{16}$ cm$^{-3}$, it is possible to afford the channel layer 17 having a low impurity concentration.

A further description will be made on the high electron mobility transistor 11. A two-dimensional electron gas 27 is formed along the interface between the channel layer 17 and the semiconductor layer 19 and in the channel layer 17. The conduction of the two-dimensional electron gas 27 is controlled by a voltage applied to the gate electrode 21. This control modulates the drain current flowing from the drain electrode 25 to the source electrode 23.

Carbon in the gallium nitride is an impurity that behaves like an acceptor and makes the resistance of the epitaxial layer higher by compensating for donors. For that reason, it is necessary to realize a carbon concentration sufficiently higher than the concentration of donor (silicon (Si) and oxygen (O) impurities (which concentration is on the order of the first half of the 16$^{th}$ power), as well as the concentration of the donor-like defects. Therefore, the carbon concentration $N_{C1}$ of the first gallium nitride semiconductor is preferably $4 \times 10^{17}$ cm$^{-3}$ or more. In addition, since impurity in the epitaxial layer contributes to the scattering of electrons, the carbon concentration of the epitaxial layer for manufacturing the channel layer is preferably similar to or lower than other impurities. Accordingly, the carbon concentration $N_{C2}$ of the second gallium nitride semiconductor is preferably $4 \times 10^{16}$ cm$^{-3}$ or less.

As one example of the high electron mobility transistor 11:
supporting substrate 13: gallium nitride (average dislocation density: $1 \times 10^6$ cm$^{-2}$);
buffer layer 15: undoped GaN, thickness 3 μm (carbon concentration $N_{C1}$: $2 \times 10^{18}$ cm$^{-3}$);
channel layer 17: undoped GaN, thickness 100 nm (carbon concentration $N_{C2}$: $2 \times 10^{16}$ cm$^{-3}$);
semiconductor layer 19: undoped Al$_{0.25}$Ga$_{0.75}$N, thickness 30 nm;
gate electrode 21: Schottky junction, Au; and
source electrode 23 and drain electrode 25: ohmic junction, Ti/Al.

The combination of the gallium nitride semiconductors is not limited to the foregoing; it is possible to combine the first gallium nitride semiconductor, the second gallium nitride semiconductor, and the third gallium nitride semiconductor in various ways.

Embodiment Mode 2

Figure 2:
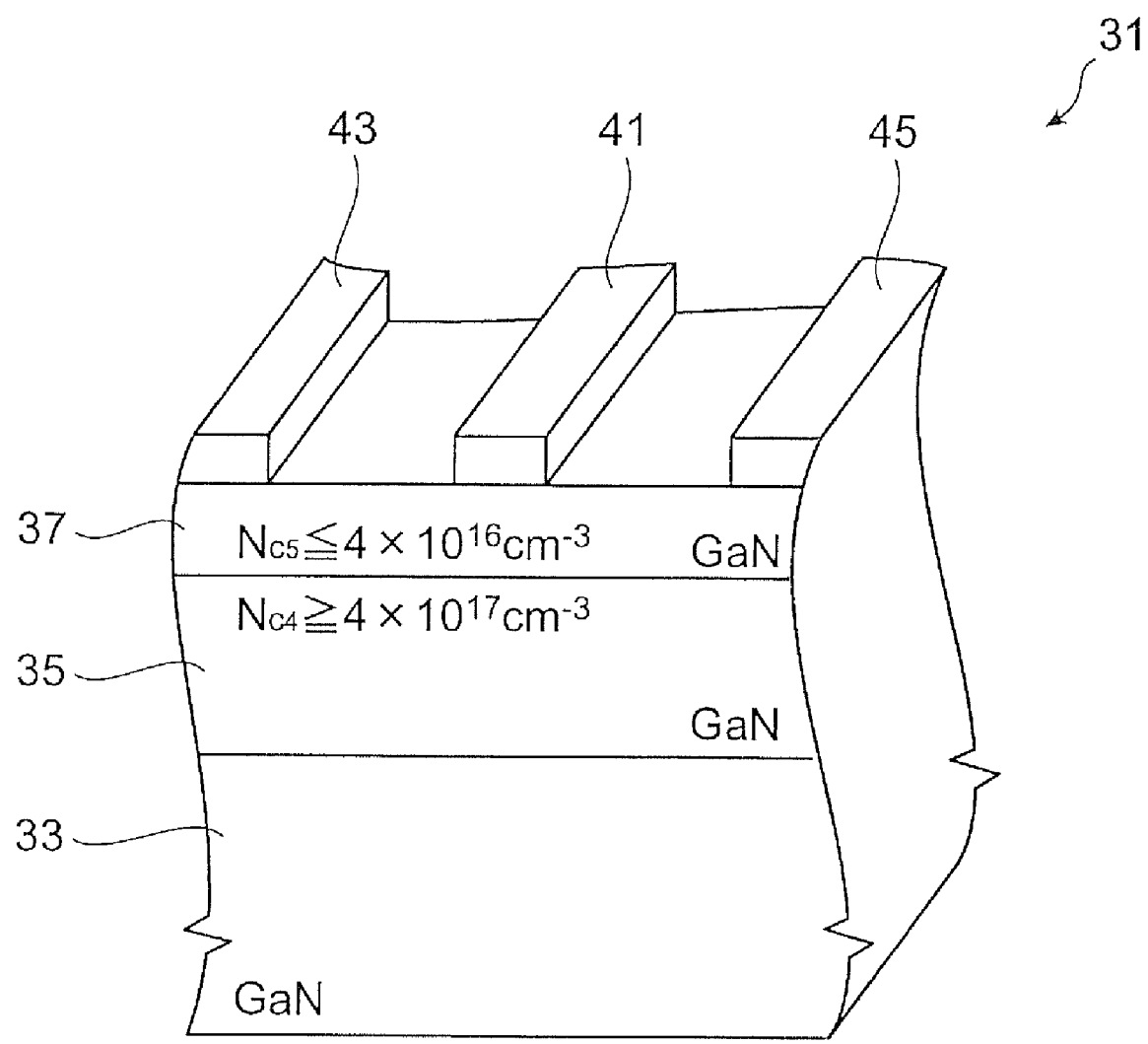
FIG. 2 is a view representing the structure of the field-effect transistor involving the present embodiment.

FIG. 2 shows an MES field-effect transistor having a gate of MES type as one example of structures of field-effect transistors involving the present embodiment. The following description can be applied to an MIS field-effect transistor having a gate of MIS type as well. An MES field-effect transistor 31 includes a supporting substrate 33 composed of gallium nitride, a buffer layer 35 composed of a first gallium nitride semiconductor, a channel layer 37 composed of a second gallium nitride semiconductor, and electrode structures (a gate electrode 41, a source electrode 43, and a drain electrode 45) for the transistor. The buffer layer 35 is disposed on the supporting substrate 33. The channel layer 37 is disposed on the buffer layer 35. The gate electrode 41, the source electrode 43 and the drain electrode 45 are disposed on the channel layer 37. The carbon concentration $N_{C4}$ of the first gallium nitride semiconductor is $4 \times 10^{17}$ cm$^{-3}$ or more. The carbon concentration $N_{C5}$ of the second gallium nitride semiconductor is less than $4 \times 10^{16}$ cm$^{-3}$.

According to the MES field-effect transistor 31, since the carbon concentration NC4 of the first gallium nitride semiconductor is $4 \times 10^{17}$ cm$^{-3}$ or more, the buffer layer 35 having a high resistivity can be provided. Furthermore, since the carbon concentration $N_{C5}$ of the second gallium nitride semiconductor is less than $4 \times 10^{16}$ cm$^{-3}$, the channel layer 37 having a low impurity concentration can be provided.

A further description will be made on the MES field-effect transistor 31. According to a voltage applied to the gate electrode 41, a depletion layer is formed in the channel layer 37. The carriers flowing through the channel layer 37 is controlled by a voltage applied to the gate electrode 41. This control modulates the drain current flowing from the drain electrode 45 to the source electrode 43.

As one example of the MES field-effect transistor 31:
supporting substrate 33: gallium nitride (average dislocation density: $1 \times 10^6$ cm$^{-2}$);
buffer layer 35: undoped GaN, thickness of 3 μm (carbon concentration $N_{C1}$: $2 \times 10^{18}$ cm$^{-3}$);
channel layer 37: n-type GaN, thickness of 500 nm;
carrier concentration $1 \times 10^{17}$ cm$^{-3}$ (carbon concentration $N_{C2}$: $2 \times 10^{16}$ cm$^{-3}$);
gate electrode 41: Schottky junction, Au; and source electrode 43 and drain electrode 45: ohmic junction, Ti/Al.

The combination of the gallium nitride semiconductors is not limited to the foregoing; the first gallium nitride semiconductor and the second gallium nitride semiconductor can be combined in various ways.

Next, a description will be made of an embodiment of a transistor involving the first and second embodiments. The following description is made on an example of a high electron mobility transistor, but it also applicable to field-effect transistors.

EXPERIMENT 1

A description will be made on an experiment investigating improvement effects of the electron mobility. An epitaxial substrate that had been manufactured under some condition (referred to as "Condition 1," hereinafter) by controlling the carbon concentration was utilized to investigate the characteristics foe the high electron mobility transistor 11. A sapphire template (referred to as "Sap template" hereinafter) and a gallium nitride substrate were placed onto a susceptor in an OMVPE reactor, and epitaxial layers for the high electron mobility transistor 11 were grown simultaneously on these. First, under condition having a pressure of 27 kPa, Group V source flow rate/Group III source total flow rate (referred to "V/III ratio," hereinafter) of 2300, a growth temperature of 1050 degrees Celsius, and a growth speed of 3.3 µm/hour, a GaN buffer layer of 3 µm was grown. Next, under condition having a pressure of 27 kPa, a V/III ratio of 6800, a growth temperature of 1050 degrees Celsius, and a growth speed of 1.1 µm/hour, a GaN channel layer of 100 nm was grown. After that, an $Al_{0.25}Ga_{0.75}N$ layer of 30 nm was grown. By using an indium electrode formed on the $Al_{0.25}Ga_{0.75}N$ layer, the Hall measurement was performed. In the epitaxial substrate using the GaN substrate, the electron mobility was 1970 $cm^2V·s$, and the sheet carrier concentration was $1.2 \times 10^{13}$ $cm^{-2}$. In contrast, in the epitaxial substrate using the Sap template, the electron mobility was 1590 $cm^2V·s$ and the sheet carrier concentration was $1.1 \times 10^{13}$ $cm^{-2}$.

Meanwhile, under the following condition (referred to as "Condition 2," hereinafter), an epitaxial substrate was manufactured. A Sap template and a gallium nitride substrate were placed onto a susceptor in a OMVPE reactor, and then epitaxial layers for the high electron mobility transistor were grown simultaneously on these. First, under conditions including a pressure of 27 kPa, a V/III ratio of 2300, a growth temperature of 1050 degrees Celsius, and a growth speed of 3.3 µm/hour, a GaN buffer layer of 3 µm was grown, and then a GaN channel layer of 100 nm was grown under the same conditions. After that, $Al_{0.25}Ga_{0.75}N$ layer of 30 nm was grown. By using an indium electrode formed on the $Al_{0.25}Ga_{0.75}N$ layer, the Hall measurement was performed. In the epitaxial substrate using the GaN substrate, the electron mobility was 1720 $cm^2V·s$ and the sheet carrier concentration was $1.2 \times 10^{13}$ $cm^{-2}$. In contrast, in the epitaxial substrate using the Sap template, the electron mobility was 1510 $cm^2V·s$, and the sheet carrier concentration was $1.0 \times 10^{13}$ $cm^{-2}$. In the epitaxial substrate, the carbon concentration of the GaN buffer layer was substantially the same as that of the GaN channel layer.

Since the carbon concentration $N_{C2}$ ($2 \times 10^{16}$ $cm^{-3}$) of the GaN channel layer in the epitaxial substrate manufactured under the Condition 1 was lower than the carbon concentration $N_{C2}$ ($8 \times 10^{17}$ $cm^{-3}$) of the GaN channel layer in the epitaxial substrate manufactured under the Condition 2, the mobility was improved.

EXPERIMENT 2

A description will be made on an experiment on effects of the buffer leak. A Sap template and a gallium nitride substrate were placed onto a susceptor in an OMVPE reactor, and epitaxial layers for the high electron mobility transistor 11 were simultaneously grown on these. First, under conditions including a decompressed pressure of 10 kPa, a V/III ratio of 2300, a growth temperature of 1050 degrees Celsius, and a growth speed of 3.3 µm/hour, a GaN buffer layer of 3 µm was grown. Next, under a condition including a pressure of 27 kPa, a V/III ratio of 6800, a growth temperature of 1050 degrees Celsius, and a growth speed of 1.1 µm/hour, a GaN channel layer of 100 nm was grown. Under this manufacture condition, since the carbon concentration of the buffer layer was higher than that of the channel layer, the resistivity of the buffer layer increases. After that, an $Al_{0.25}Ga_{0.75}N$ layer of 30 nm was grown. A part of the $Al_{0.25}Ga_{0.75}N$ layer was etched to form mesas as in the high electron mobility transistor. A voltage was applied to an ohmic electrodes formed on the two mesas to measure the current. The current corresponded to a leak current in the high electron mobility transistor, having a value of 0.011 µA/mm when the value of the applied voltage was 20 volts.

Meanwhile, a Sap template and a gallium nitride substrate were placed onto a susceptor in the OMVPE reactor. Epitaxial layers for high electron mobility transistors were simultaneously grown on these. First, under conditions including a pressure of 50 kPa, a V/III ratio of 2300, a growth temperature of 1050 degrees Celsius, and a growth speed of 3.3 µm/hour, a GaN buffer layer of 3 µm was grown. Next, under conditions including a pressure of 27 kPa, a V/III ratio of 6800, a growth temperature of 1050 degrees Celsius, and a growth speed of 1.1 µm/hour, a GaN channel layer of 100 nm was grown. After that, an $Al_{0.25}Ga_{0.75}N$ layer of 30 nm was grown. The leak current in the high electron mobility transistor was measured as above. The value of the leak current was 35 µA/mm when the applied voltage was 20 volts.

Note that as far as the electron mobility and the sheet carrier concentration were concerned, there was no difference between the above-described two kinds of the epitaxial substrates.

Embodiment Mode 3

Figure 3:
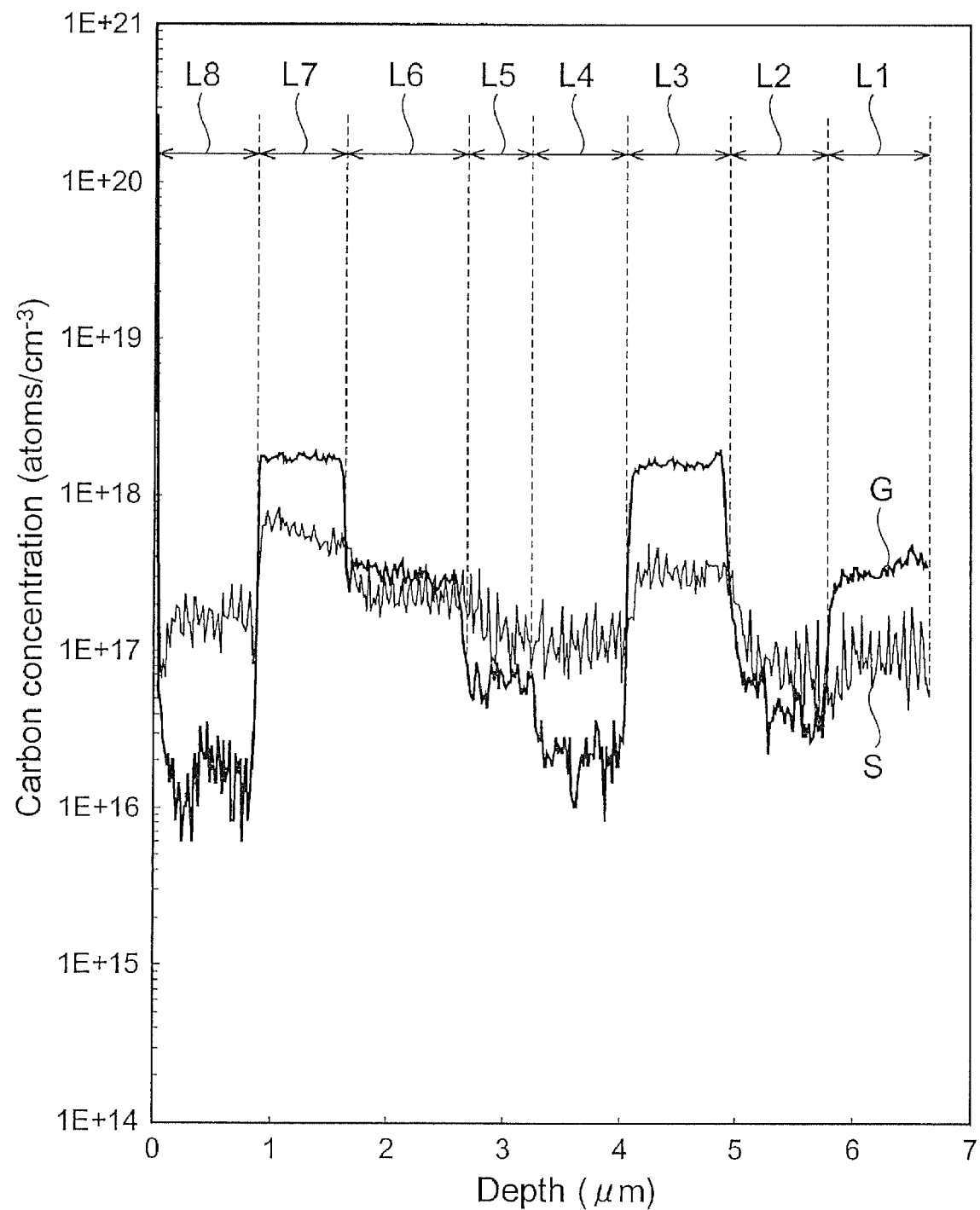
FIG. 3 is a view representing the experimental results of the deposition involving third embodiment.

FIG. 3 is a view representing experimental results of deposition involving the present embodiment. In this experiment, a gallium nitride substrate and a sapphire template were placed onto a susceptor in a reactor of a metal organic chemical vapor deposition device. By utilizing metal organic chemical vapor deposition, gallium nitride was grown on the gallium nitride substrate and the Sap template under various conditions. The Sap template included a gallium nitride low-temperature buffer layer (25 nm at 500 degrees Celsius) grown on (0001) plane of the sapphire substrate, and a gallium nitride layer (3 µm at 1050 degrees Celsius) grown on the gallium nitride low-temperature buffer layer. The average dislocation density of the gallium nitride substrate was $1 \times 10^6$ $cm^{-2}$, and the average dislocation density of the gallium nitride film of the sapphire template was $1 \times 10^9$ $cm^{-2}$, for example. Prior to the growth of the gallium nitride, the gallium nitride substrate and the sapphire template underwent pretreatments. In the pretreatment, while flowing hydrogen ($H_2$) and ammonia ($NH_3$) at a temperature of 1000 degrees Celsius for 5 minutes, the surface of the gallium nitride substrate and gallium nitride surface of the sapphire template underwent a heat treatment. Then, trimethylgallium (TMG), $NH_3$, $N_2$, and $H_2$ were supplied into the reactor to epitaxially grow undoped gallium nitride layers L1 through L8. During the growth, growth parameters such as the growth pressure, the growth temperature, the V/III ratio, and the growth speed are varied. In FIG. 3, a concentration characteristic line G represents the carbon concentrations of the gallium nitride films grown on the gallium nitride substrate, and the concentration characteristic line S represents the carbon concentrations of the gallium nitride films grown on the Sap template. As shown in FIG. 3, in correspondence with variation in the growth parameters, variation in the carbon concentration of the gallium nitride films grown on the gallium nitride substrate was larger than variation in the carbon concentration of the gallium nitride films grown on the Sap template.

The gallium nitride layer L1 was manufactured under conditions including a growth temperature of 1050 degrees Celsius, a V/III ratio of 2300, a growth speed of 3.3 μm/hour, and a growth pressure of 27 kPa.

After the growth temperature is increased to 1100 degrees Celsius, the gallium nitride layer L2 was manufactured. In other words, the gallium nitride layer L2 was manufactured under conditions including a growth temperature of 1100 degrees Celsius, a V/III ratio of 2300, a growth speed of 3.3 μm/hour, and a growth pressure of 27 kPa. Comparing the gallium nitride layer L1 and the gallium nitride layer L2, the carbon concentration of the gallium nitride layer grown on the gallium nitride substrate becomes lower at a higher growth temperature.

After the growth temperature is decreased to 1000 degrees Celsius, the gallium nitride layer L3 was manufactured. In other words, the gallium nitride layer L3 was manufactured under conditions including a growth temperature of 1000 degrees Celsius, a V/III ratio of 2300, a growth speed of 3.3 μm/hour, and a growth pressure of 27 kPa. Comparing the gallium nitride layer L2 and the gallium nitride layer L3, the carbon concentration of the gallium nitride layer grown on the gallium nitride substrate becomes higher at a lower growth temperature.

After the growth speed is lowered to 1.1 μm/hour, the temperature is raised to 1050 degrees Celsius, and the V/III ratio is increased to 6800, the gallium nitride layer L4 was manufactured. In other words, the gallium nitride layer L4 was manufactured under condition having a growth temperature of 1050 degrees Celsius, a V/III ratio of 6800, a growth speed of 1.1 μm/hour, and a growth pressure of 27 kPa. Comparing the gallium nitride layer L3 and the gallium nitride layer L4, the carbon concentration of the gallium nitride layer grown on the gallium nitride substrate becomes lower as the V/III ratio increases and the deposition rate decreases.

In order to manufacture the gallium nitride layer L5, the V/III ratio was decreased to 3100. In other words, the gallium nitride layer L5 was manufactured under conditions including a growth temperature of 1050 degrees Celsius, a V/III ratio of 3100, a growth speed of 3.3 μm/hour, and a growth pressure of 27 kPa. Comparing the gallium nitride layer L4 and the gallium nitride layer L5, the carbon concentration of the gallium nitride layer grown on the gallium nitride substrate increases as the V/III ratio decreases.

In order to manufacture the gallium nitride layer L6, the V/III ratio was further decreased to 1350. In other words, the gallium nitride layer L6 was manufactured under conditions including a growth temperature of 1050 degrees Celsius, a V/III ratio of 1350, a growth speed of 3.3 μm/hour, and a growth pressure of 27 kPa. Comparing the gallium nitride layer L5 and the gallium nitride layer L6, the carbon concentration of the gallium nitride layer grown on the gallium nitride substrate increases as the V/III ratio decreases.

In order to manufacture the gallium nitride layer L7, the growth pressure was lowered to 10 kPa. In other words, the gallium nitride layer L6 was manufactured under conditions including a growth temperature of 1050 degrees Celsius, a V/III ratio of 1350, a growth speed of 3.3 μm/hour, and a growth pressure of 10 kPa. Comparing the gallium nitride layer L6 and the gallium nitride layer L7, the carbon concentration of the gallium nitride layer grown on the gallium nitride substrate increases as the growth pressure decreases.

In order to manufacture the gallium nitride layer L8, the growth pressure was raised to 101 kPa. In other words, the gallium nitride layer L6 was manufactured under conditions including a growth temperature of 1050 degrees Celsius, a V/III ratio of 1350, a growth speed of 3.3 μm/hour, and a growth pressure of 101 kPa. Comparing the gallium nitride layer L6 and the gallium nitride layer L7, the carbon concentration of the gallium nitride layer grown on the gallium nitride substrate decreases as the growth pressure increases.

As described in the foregoing, in response to variation in the growth parameters, variation (about two orders of magnitude) in the carbon concentration of the gallium nitride film grown on the gallium nitride substrate is larger than variation (at most one order of magnitude) in the carbon concentration of the gallium nitride film grown on the Sap template. In other words, although the carbon concentration of the Sap template grown on gallium nitride film does not vary to a large extent in response to the variation of the growth parameters, the carbon concentration of the gallium nitride substrate grown on the gallium nitride film varies to a large extent in response to the variation of the growth parameters.

Figure 4A:
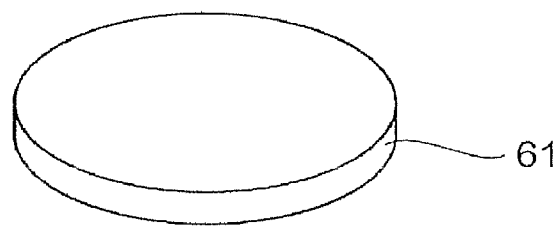
FIG. 4A is a view representing the method of manufacturing the epitaxial substrate as a first example.
Figure 4B:
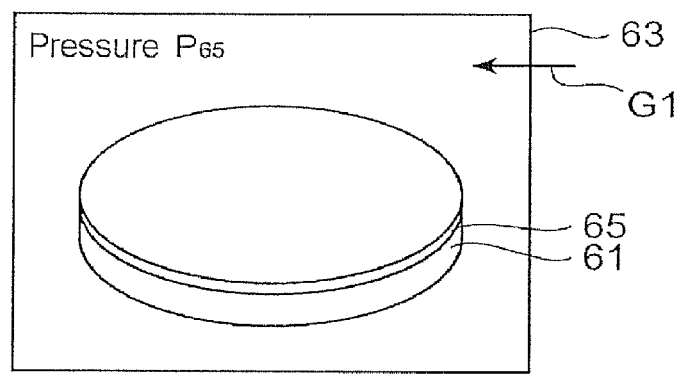
FIG. 4B is a view representing the method of manufacturing the epitaxial substrate as a first example.
Figure 4C:
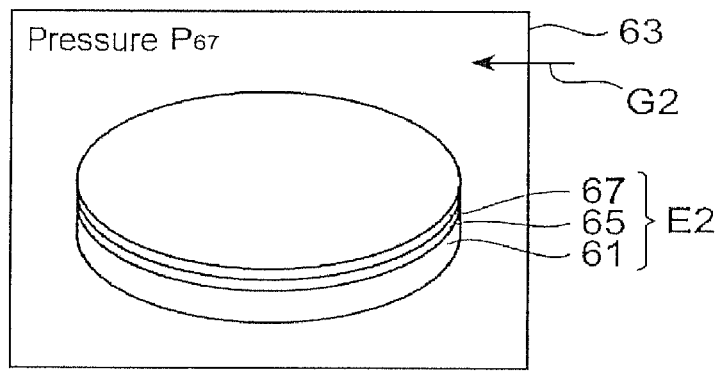
FIG. 4C is a view representing the method of manufacturing the epitaxial substrate as a first example.

Next, a concrete description will be made of a method of manufacturing epitaxial substrates for Group III nitride transistors. FIG. 4A, FIG. 4B, FIG. 4C and FIG. 4D are views for illustrating a method of manufacturing an epitaxial substrate as a first example. As shown in FIG. 4A, a gallium nitride substrate 61 is prepared. The average dislocation density of the gallium nitride substrate 61 is $1 \times 10^6$ $cm^{-2}$ or less. As shown in FIG. 4B, after the gallium nitride substrate 61 is placed on a susceptor in a reactor 63, the pretreatment is carried out as previously described. Next, the source gas G1 (TMG, $NH_3$, $H_2$) is supplied into the reactor 63 to grow a gallium nitride semiconductor film for the buffer layer, e.g., a gallium nitride epitaxial film 65, at a reduced pressure ($P_{65}$). Next, as shown in FIG. 4C, the source gas G2 (TMG, $NH_3$, $H_2$) is supplied into the reactor 63 to grow a gallium nitride semiconductor for the channel layer, e.g., a gallium nitride epitaxial film 67 at an atmospheric pressure ($P_{67}$). In this example, since the gallium nitride films for the buffer layer and the channel layer are manufactured at different pressures, the gallium nitride films 65 and 67 have different carbon concentrations.

One example of the main conditions for manufacturing the gallium nitride films 65 and 67 and their carbon concentrations is as follows.

|  | Gallium nitride film 65 | Gallium nitride film 67 |
| --- | --- | --- |
| Reactor pressure: | 10 kPa | 101 kPa |
| Reactor temperature: | 1050° C. | 1050° C. |
| Growth speed: | 3.3 μm | 3.3 μm |
| V/III ratio: | 2300 | 2300 |
| Carbon concentration: | $2 \times 10^{18}$ $cm^{-3}$ | $1 \times 10^{16}$ $cm^{-3}$ |

It is possible to employ a range between 27 kPa and 1 kPa as a preferable range for the growth of the gallium nitride film

65, and to employ a range between 101 kPa and 27 kPa as a preferable range for the growth of the gallium nitride film 67.

According to this method, under manufacture conditions where the pressure at which the gallium nitride film 67 is grown is higher than the pressure at which the gallium nitride film 65 is grown, the gallium nitride film 65 and the gallium nitride film 67 are grown on the gallium nitride substrate. Accordingly, it is possible to set the carbon concentration of the gallium nitride film 65 to be $4\times10^{17}$ cm$^{-3}$ or more, and to set the carbon concentration of the gallium nitride film 67 to be less than $4\times10^{16}$ cm$^{-3}$.

According to this manufacture method, an epitaxial substrate E1 is provided with the gallium nitride substrate 61, a first gallium nitride semiconductor film (the gallium nitride film 65 in this embodiment) having a carbon concentration of $4\times10^{17}$ cm$^{-3}$ or more, and a gallium nitride semiconductor film (the gallium nitride film 67 in this embodiment) having a carbon concentration of less than $4\times10^{16}$ cm$^{-3}$.

Figure 4D:
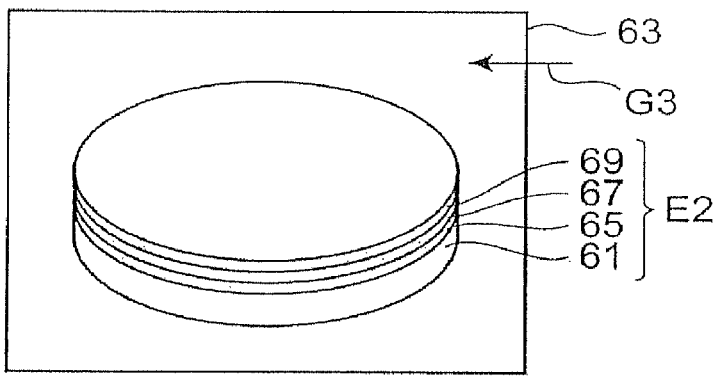
FIG. 4D is a view representing the method of manufacturing the epitaxial substrate as a first example.

Next, a description will be made on a method of manufacturing an epitaxial substrate E2 for Group III nitride transistors such as high electron mobility transistors. Following the growth of the gallium nitride films 65 and 67, as shown in FIG. 4D, the source gas G3 (TMG, TMAl, NH$_3$, H$_2$) is supplied into the reactor 63 to grow the gallium nitride semiconductor having the band gap broader than that of the gallium nitride semiconductor for the channel layer, e.g., an AlGaN epitaxial film 69. According to this manufacture method, the epitaxial substrate E2 is provided with the gallium nitride substrate 61, a first gallium nitride semiconductor film (the GaN film 65 in the present embodiment) having a carbon concentration of $4\times10^{17}$ cm$^{-3}$ or more, a gallium nitride semiconductor film (the GaN film 67 in the present embodiment) having a carbon concentration of less than $4\times10^{16}$ cm$^{-3}$, and a gallium nitride semiconductor film (the AlGaN film 69 in the present embodiment).

Figure 5A:
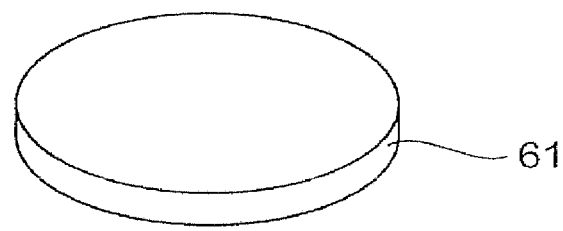
FIG. 5A is a view representing the method of manufacturing the epitaxial substrate as a second example.
Figure 5B:
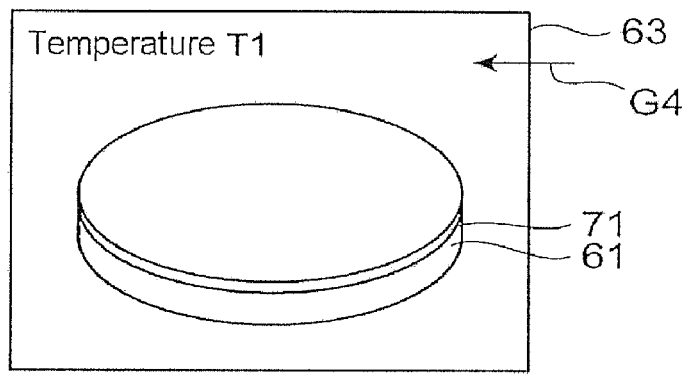
FIG. 5B is a view representing the method of manufacturing the epitaxial substrate as a second example.
Figure 5C:
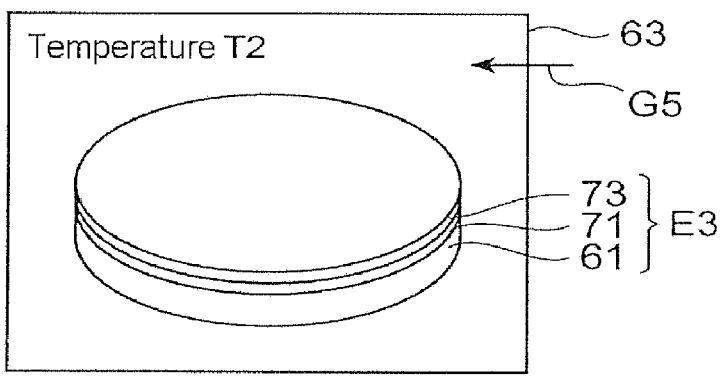
FIG. 5C is a view representing the method of manufacturing the epitaxial substrate as a second example.

FIG. 5A, FIG. 5B, FIG. 5C and FIG. 5D are views illustrating a method of manufacturing the epitaxial substrate as a second example. As shown in FIG. 5A, the gallium nitride substrate 61 is prepared. The gallium nitride substrate 61 undergoes a pretreatment in the reactor 63 as described above. As shown in FIG. 5B, the source gas G4 (TMG, NH$_3$, H$_2$) is supplied into the reactor 63 to grow a gallium nitride semiconductor film for the buffer layer, e.g., a gallium nitride epitaxial film 71, at temperature T1. Then, as shown in FIG. 5C, the source gas G5 (TMG, NH$_3$, H$_2$) is supplied into the reactor 63, a gallium nitride semiconductor for the channel layer, e.g., a gallium nitride epitaxial film 73 is manufactured at temperature T2, which is lower than temperature T1. In this example, since the gallium nitride films for the buffer layer and the channel layer are manufactured at different temperatures, the carbon concentration of the gallium nitride films 71 and 73 are different.

One example of the main conditions for manufacturing the gallium nitride films 71 and 73 and their carbon concentrations is as follows.

|  | Gallium nitride film 71 | Gallium nitride film 73 |
| --- | --- | --- |
| Reactor pressure: | 27 kPa | 27 kPa |
| Reactor temperature: | 1000° C. | 1100° C. |
| Growth speed: | 3.3 µm | 3.3 µm |
| V/III ratio: | 2300 | 2300 |
| Carbon concentration: | $2 \times 10^{18}$ cm$^{-3}$ | $3 \times 10^{16}$ cm$^{-3}$ |

It is possible to employ a range between 950 C and 1050 C as a preferable temperature range for the growth of the gallium nitride film 71, and to employ a range between 1050 C and 1150 C as a preferable temperature range for the growth of the gallium nitride film 73. According to this manufacture method, an epitaxial substrate E3 is provided with the gallium nitride substrate 61, the gallium nitride film 71, and the gallium nitride film 73.

According to this method, the gallium nitride film 71 and the gallium nitride film 73 are grown on the gallium nitride substrate 61 under manufacture conditions where the temperature at which the gallium nitride film 73 is grown is higher than the temperature at which the gallium nitride film 71 is grown. Accordingly, it is possible to set the carbon concentration of the gallium nitride film 71 to be $4\times10^{17}$ cm$^{-3}$ or more, and to set the carbon concentration of the gallium nitride film 73 to be less than $4\times10^{16}$ cm$^{-3}$.

Figure 5D:
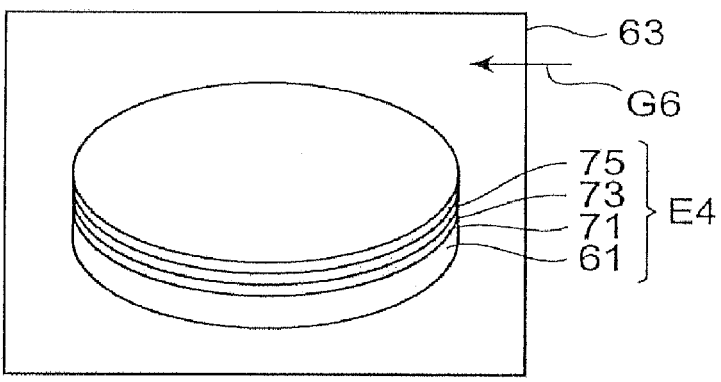
FIG. 5D is a view representing the method of manufacturing the epitaxial substrate as a second example.

Next, a description will be made of a method of manufacturing an epitaxial substrate E4 for Group III nitride transistors such as high electron mobility transistors. Following the growth of the gallium nitride films 71 and 73, as shown in FIG. 5D, the source gas G6 (TMG, TMAl, NH$_3$, H$_2$) is supplied into the reactor 63 to grow a gallium nitride semiconductor having the band gap broader than that of the gallium nitride semiconductor for the channel layer, e.g., an AlGaN epitaxial film 75. According to this manufacture method, the epitaxial substrate E4 is provided with the gallium nitride substrate 61, the GaN film 71, the GaN film 73, and the AlGaN film 75.

Figure 6A:
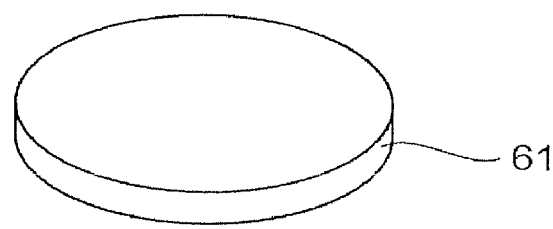
FIG. 6A is a view representing the method of manufacturing the epitaxial substrate as a third example.
Figure 6B:
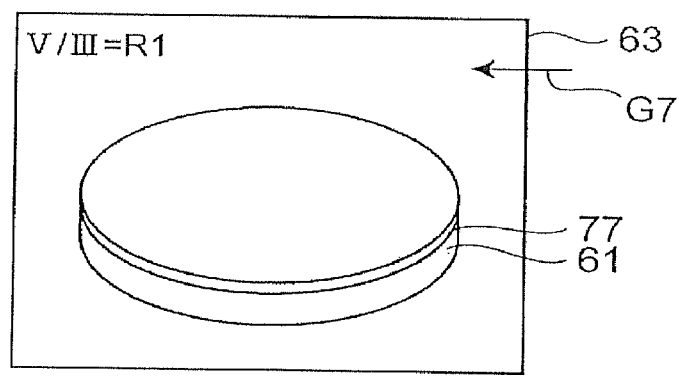
FIG. 6B is a view representing the method of manufacturing the epitaxial substrate as a third example.
Figure 6C:
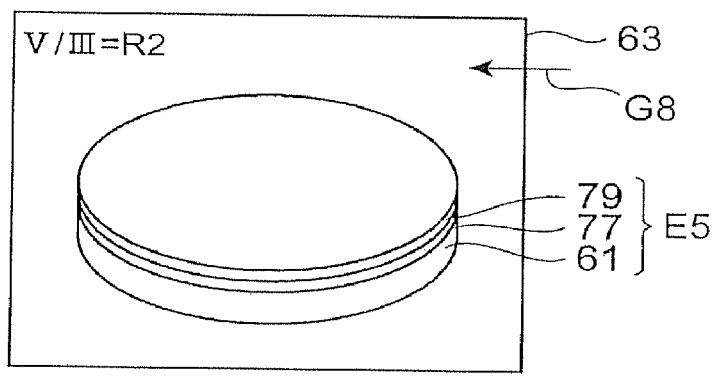
FIG. 6C is a view representing the method of manufacturing the epitaxial substrate as a third example.

FIG. 6A, FIG. 6B, FIG. 6C and FIG. 6D are views illustrating a method of manufacturing the epitaxial substrate as a third example. As shown in FIG. 6A, the gallium nitride substrate 61 is prepared. The gallium nitride substrate 61 undergoes a pretreatment in the reactor 63 as described above. As shown in FIG. 6B, the source gas G7 (TMG, NH$_3$, H$_2$) is supplied into the reactor 63 to grow a gallium nitride semiconductor film for the buffer layer, e.g., a gallium nitride epitaxial film 77 with V/III ratio R1. Next, as shown in FIG. 6C, the source gas G8 (TMG, NH$_3$, H$_2$) is supplied into the reactor 63 to grow a gallium nitride semiconductor for the channel layer, e.g., a gallium nitride epitaxial film 79 with V/III ratio R2, which is lower than the V/III ratio R1. In this example, since the gallium nitride films for the buffer layer and the channel layer are manufactured with different V/III ratios, the carbon concentrations of the gallium nitride films 77 and 79 are different.

One of the main conditions for manufacturing the gallium nitride films 77 and 79 and their carbon concentrations is as follows.

|  | Gallium nitride film 77 | Gallium nitride film 79 |
| --- | --- | --- |
| Reactor pressure: | 27 kPa | 27 kPa |
| Reactor temperature: | 1050° C. | 1050° C. |
| Growth speed: | 3.3 µm | 3.3 µm |
| V/III ratio: | 1000 | 5000 |
| Carbon concentration: | $6 \times 10^{17}$ cm$^{-3}$ | $4 \times 10^{16}$ cm$^{-3}$ |

It is possible to employ a range between 2000 and 100 as a preferable V/III ratio for the growth of the gallium nitride film 77, and to employ a range between 1000 and 10000 as a preferable range of V/III ratio for the growth speed of the gallium nitride film 79. According to this manufacture method, an epitaxial substrate E5 is provided with the gallium nitride substrate 61, the gallium nitride film 77, and the gallium nitride film 79.

According to this method, the gallium nitride film 77 and the gallium nitride film 79 are grown on the gallium nitride substrate under manufacture conditions where the V/III ratio R2 for the gallium nitride film 79 is lower than the V/III ratio R1 for the growth of the gallium nitride film 77. Accordingly, it is possible to set the carbon concentration of the gallium nitride film 77 to be $4\times10^{17}$ cm$^{-3}$ or more, and to set the carbon concentration of the gallium nitride film 79 to be less than $4\times10^{16}$ cm$^{-3}$.

Figure 6D:
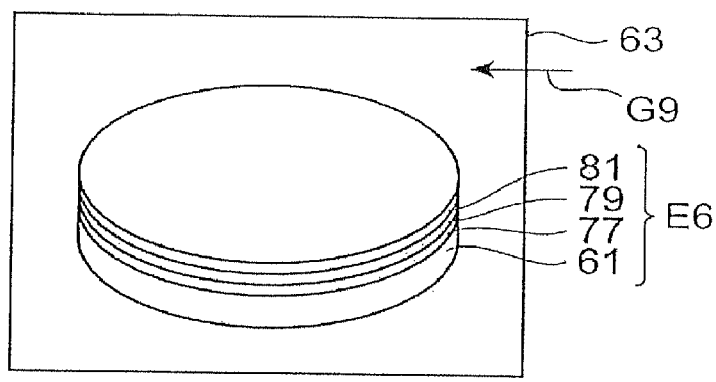
FIG. 6D is a view representing the method of manufacturing the epitaxial substrate as a third example.

Next, a description will be made of an epitaxial substrate E6 for Group III nitride transistors such as high electron mobility transistors. Following the growth of the gallium nitride films 77 and 79, as shown in FIG. 6D, the source gas G9 (TMG, TMAl, NH$_3$, H$_2$) is supplied into the reactor 63 to grow a gallium nitride semiconductor having the band gap broader than that of the gallium nitride semiconductor for the channel layer, e.g., an AlGaN epitaxial film 81. According to this manufacture method, the epitaxial substrate E6 is provided with the gallium nitride substrate 61, the GaN film 77, the GaN film 79, and the AlGaN film 81.

Furthermore, the change of the V/III ratio makes it possible to change the flow rate of TMG such as organic gallium, the flow rate of nitrogen source such as NH$_3$, and the flow rates of both of the gallium source and the nitrogen source.

Figure 7A:
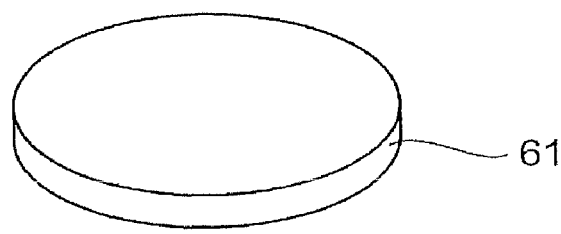
FIG. 7A is a view representing the method of manufacturing the epitaxial substrate as a fourth example.
Figure 7B:
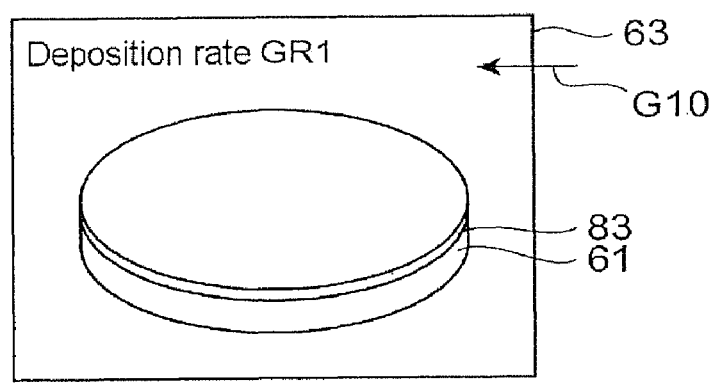
FIG. 7B is a view representing the method of manufacturing the epitaxial substrate as a fourth example.
Figure 7C:
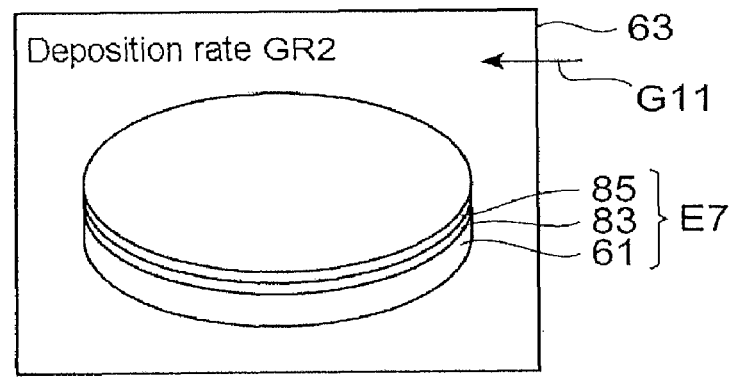
FIG. 7C is a view representing the method of manufacturing the epitaxial substrate as a fourth example.

FIG. 7A, FIG. 7B, FIG. 7C and FIG. 7D are views illustrating a method of manufacturing an epitaxial substrate as a fourth example. As shown in FIG. 7A, the gallium nitride substrate 61 is prepared. The gallium nitride substrate 61 undergoes a pretreatment in the reactor 63 as described above. As shown in FIG. 7B, the source gas G10 (TMG, NH$_3$, H$_2$) is supplied into the reactor 63 to grow a gallium nitride semiconductor film for the buffer layer, e.g., the gallium nitride epitaxial film 83, at deposition rate GR1. Then, as shown in FIG. 7C, the source gas G11 (TMG, NH$_3$, H$_2$) is supplied into the reactor 63 to grow a gallium nitride semiconductor for the channel layer, e.g., a gallium nitride epitaxial film 85, at deposition rate GR2, which is higher than the deposition rate GR1. In this example, since the gallium nitride films for the buffer layer and the channel layer are formed at different deposition rates, the carbon concentrations of the gallium nitride films 83 and 85 are different.

One example of the main conditions for manufacturing the gallium nitride films 83 and 85 and their carbon concentrations is as follows.

|  | Gallium nitride film 83 | Gallium nitride film 85 |
|---|---|---|
| Reactor pressure: | 27 kPa | 27 kPa |
| Reactor temperature: | 1050° C. | 1050° C. |
| Growth speed: | 6.6 μm | 1.1 μm |
| V/III ratio: | 1200 | 6800 |
| Carbon concentration: | $8 \times 10^{17}$ cm$^{-3}$ | $2 \times 10^{16}$ cm$^{-3}$ |

It is possible to employ a range between 2 μm/hour and 20 μm/hour as a preferable range of the growth speed of the gallium nitride film 83, and to employ a range between 0.1 μm/hour and 4 μm/hour as a preferable range of the growth speed of the gallium nitride film 85. According to this manufacture method, an epitaxial substrate E7 is provided with the gallium nitride substrate 61, the gallium nitride film 83, and the gallium nitride film 85.

According to this method, the gallium nitride film 83 and the gallium nitride film 85 are grown on the gallium nitride substrate under manufacture conditions where the deposition rate GR1 for the gallium nitride film 83 is higher than the deposition rate GR2 for the growth of gallium nitride film 85. Accordingly, it is possible to set the carbon concentration of the gallium nitride film 83 to be $4\times10^{17}$ cm$^{-3}$ or more, and to set the carbon concentration of the gallium nitride film 85 to be less than $4\times10^{16}$ cm$^{-3}$.

Figure 7D:
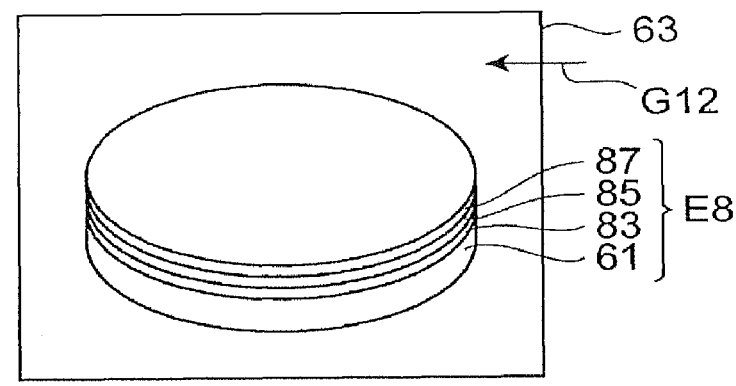
FIG. 7D is a view representing the method of manufacturing the epitaxial substrate as fourth example.

Next, a description will be made of a manufacture method of an epitaxial substrate E8 for Group III nitride transistors such as high electron mobility transistors. Following the growth of the gallium nitride films 83 and 85, as shown in FIG. 7D, the source gas G12 (TMG, TMAl, NH$_3$, H$_2$) is supplied into the reactor 63 to grow a gallium nitride semiconductor having the band gap broader than that of the gallium nitride semiconductor for the channel layer, e.g., an AlGaN epitaxial film 87. According to this manufacture method, the epitaxial substrate E8 is provided with the gallium nitride substrate 61, the GaN film 83, the GaN film 85, and the AlGaN film 87.

The epitaxial substrates E1 through E8 include the second gallium nitride semiconductor film having low impurity concentration formed on the first gallium nitride semiconductor film having a high resistivity. Accordingly, they are preferable for Group III nitride transistors such as field-effect transistors and high electron mobility transistors.

As described above, methods of manufacturing gallium nitride films for the buffer layer having a high carbon concentration and a gallium nitride film for the channel layer having a low carbon concentration by using gallium nitride substrates can be also achieved by combining the examples as describe above.

In order to manufacture the epitaxial substrate, the following conditions (1) through (6) can be combined:
(1) The flow rate of organic gallium at which the channel layer is grown is lower than the flow rate of organic gallium at which the buffer layer is grown.
(2) The flow rate of the nitrogen source at which the channel layer is grown is higher than that of the nitrogen source at which the buffer layer is grown.
(3) The V/III ratio with which the channel layer is grown is higher than the V/III ratio with which the buffer layer is grown.
(4) The temperature at which the channel layer is grown is higher the temperature at which the buffer layer is grown.
(5) The pressure at which the channel layer is grown is higher than the pressure at which the buffer layer is grown.
(6) The speed at which the first gallium nitride semiconductor is grown is higher than the speed at which the second gallium nitride semiconductor is grown.

One example of the main conditions for manufacturing the gallium nitride films and their carbon concentrations is as follows.

|  | Buffer GaN film | Channel GaN film |
|---|---|---|
| Reactor pressure: | 27 kPa | 101 kPa |
| Reactor temperature: | 1050° C. | 1050° C. |
| Growth speed: | 6.6 μm | 1.1 μm |
| V/III ratio: | 1200 | 6800 |
| Carbon concentration: | $6 \times 10^{17}$ cm$^{-3}$ | $1 \times 10^{16}$ cm$^{-3}$ |

Another example of the main conditions for manufacturing the gallium nitride film and their carbon concentrations is as follows.

|  | Buffer GaN film | Channel GaN film |
|---|---|---|
| Reactor pressure: | 27 kPa | 101 kPa |
| Reactor temperature: | 1050° C. | 1100° C. |
| Growth speed: | 6.6 μm | 1.1 μm |
| V/III ratio: | 1200 | 6800 |
| Carbon concentration: | $6 \times 10^{17}$ cm$^{-3}$ | $1 \times 10^{16}$ cm$^{-3}$ |

Embodiment Mode 4

Figure 8A:
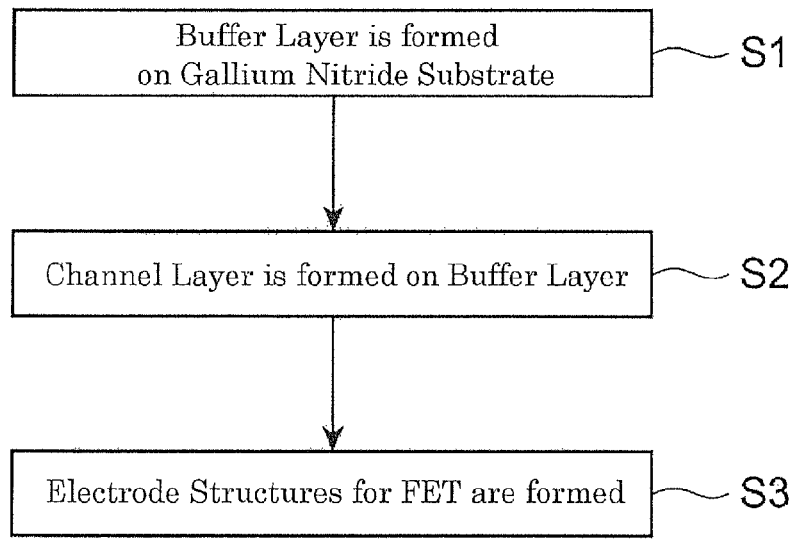
FIG. 8A is a flow chart illustrating the manufacture of the MES field-effect transistor.

FIG. 8A is a flow chart of illustrating the manufacture of a field-effect transistor. First, in step S1, by utilizing metal organic chemical vapor deposition, a buffer layer composed of a first gallium nitride semiconductor having a carbon concentration of $4 \times 10^{17}$ cm$^{-3}$ or more is grown onto a gallium nitride substrate. In step S2, by utilizing metal organic chemical vapor deposition, a channel layer composed of a second gallium nitride semiconductor having a carbon concentration of less than $4 \times 10^{16}$ cm$^{-3}$ is grown onto the buffer layer. In step S3, electrode structures (a gate electrode, a source electrode, and a drain electrode) for MES field-effect transistors are grown onto the channel layer. According to this method, a transistor having a high-purity channel layer and a high-resistance buffer layer can be manufactured.

Figure 8B:
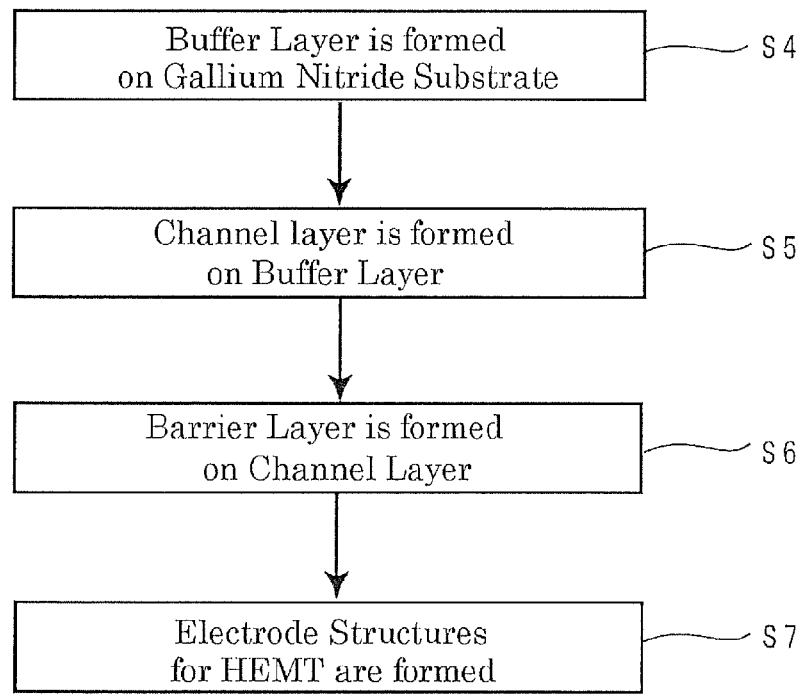
FIG. 8B is a flow chart illustrating the manufacture of the high electron mobility transistor.

FIG. 8B is a flow chart illustrating the manufacture of high electron mobility transistors. First, in step S4, by utilizing metal organic chemical vapor deposition, a buffer layer composed of a first gallium nitride semiconductor having a carbon concentration of $4 \times 10^{17}$ cm$^{-3}$ or more is grown onto a gallium nitride substrate. In step S5, by utilizing metal organic chemical vapor deposition, a channel layer composed of a second gallium nitride semiconductor having a carbon concentration of less than $4 \times 10^{16}$ cm$^{-3}$ is grown onto the buffer layer. In step S6, by utilizing metal organic chemical vapor deposition, a barrier layer composed of a third gallium nitride semiconductor is grown onto the channel layer. In step S7, electrode structures (a gate electrode, a source electrode, and a drain electrode) for high electron mobility transistors are formed on the channel layer. According to this method, a transistor having a high-purity channel layer and a high-resistance buffer layer as well as a barrier layer can be manufactured.

One example of the main conditions for manufacturing the high electron mobility transistor and its carbon concentration is as follows.

|  | Buffer GaN | Channel GaN | Barrier AlGaN |
|---|---|---|---|
| Reactor pressure: | 27 kPa | 27 kPa | 27 kPa |
| Reactor temperature: | 1050° C. | 1050° C. | 1050° C. |
| Growth speed: | 6.6 μm | 1.1 μm |  |
| V/III ratio: | 1200 | 6800 |  |
| NH$_3$ flow rate: | 6 slm | 6 slm | 6 slm |
| Carbon concentration: | $6 \times 10^{17}$ cm$^{-3}$ | $2 \times 10^{16}$ cm$^{-3}$ |  |

In this embodiment, transiting from the buffer layer to the channel layer, and transiting from the channel layer to the barrier layer, the flow rates of the Group III organic source gas such as TMG and TMA are changed, but none of the pressure, the temperature, the ammonia flow rate, or the carrier flow rate is changed.

As described above, even if a gallium nitride is formed on a sapphire substrate or a SiC substrate under various conditions (the growth temperature, the growth pressure, the growth speed, the V/III ratio, etc.), it is impossible to change the impurity concentration (carbon, for example) of the grown gallium nitride layers to a large extent. However, if an GaN substrate having an extremely low dislocation is used to manufacture the epitaxial film, it is possible to extremely improve the controllability of the impurities in the film. When the GaN substrate is used, the carbon concentration is changed by two orders of magnitude or more in response to the change of the growth conditions, for example. By utilizing the controllability to adjust a content of carbon, it is possible to afford epitaxial films having preferable properties (resistivity and mobility) for the buffer layer and the channel layer, respectively. As a result, it is possible to manufacture semiconductor layers including a buffer layer having a high resistance and a channel layer having a high purity.

Preferable embodiments have been chosen to illustrate principles of the present invention. To those skilled in the art, however, it will be apparent from the foregoing disclosure that various changes and modifications can be made herein on locations and details without departing from the scope of the invention as defined in the appended claims. The present invention is not limited to specific structures disclosed in the present embodiments. The present invention is not limited to specific materials described in the present embodiments. For example, AlGaN can be used as a material for the buffer layer, and InGaN can be used as a material for the channel layer. In addition AlGaN and AlN can be used, as materials for the barrier layer. Accordingly, the rights in the scope of the patent claims, and in all modifications and changes deriving from the scope of the spirit thereof are claimed.

What is claimed is:

1. A high electron mobility transistor comprising:
   a supporting substrate composed of gallium nitride;
   a buffer layer composed of a first gallium nitride semiconductor, provided on said supporting substrate;
   a channel layer composed of a second gallium nitride semiconductor, provided on said buffer layer;
   a semiconductor layer composed of a third gallium nitride semiconductor, provided on said buffer layer, said third gallium nitride semiconductor having a band gap broader than that of said second gallium nitride semiconductor; and
   a gate electrode, a source electrode and a drain electrode provided on said semiconductor layer; wherein
      the carbon concentration of said first gallium nitride semiconductor is $4 \times 10^{17}$ cm$^{-3}$ or more, and
      the carbon concentration of said second gallium nitride semiconductor is less than $4 \times 10^{16}$ cm$^{-3}$.

2. A field-effect transistor comprising:
   a supporting substrate composed of gallium nitride;
   a buffer layer composed of a first gallium nitride semiconductor, provided on said supporting substrate;
   a channel layer composed of a second gallium nitride semiconductor, provided on said buffer layer; and
   a gate electrode, a source electrode and a drain electrode provided on said channel layer; wherein
      the carbon concentration of said first gallium nitride semiconductor is $4 \times 10^{17}$ cm$^{-3}$ or more, and
      the carbon concentration of said second gallium nitride semiconductor is less than $4 \times 10^{16}$ cm$^{-3}$.

3. An epitaxial substrate for Group III nitride transistors, the epitaxial substrate comprising:
- a gallium nitride substrate;
- a first semiconductor film composed of a first gallium nitride semiconductor, provided on said gallium nitride substrate; and
- a second semiconductor film composed of a second gallium nitride semiconductor, provided on said first semiconductor film; wherein
    - the carbon concentration of said first gallium nitride semiconductor is $4\times10^{17}$ cm$^{-3}$ or more, and
    - the carbon concentration of said second gallium nitride semiconductor is less than $4\times10^{16}$ cm$^{-3}$.

4. The epitaxial substrate set forth in claim 3, further comprising a third semiconductor film composed of a third gallium nitride semiconductor having a band gap broader than the band gap of said second gallium nitride semiconductor, said third semiconductor film being provided on said first semiconductor film.

* * * * *